(12) United States Patent
Ueno (10) Patent No.: US 7,566,973 B2
(45) Date of Patent: Jul. 28, 2009

(54) SEMICONDUCTOR DEVICE AND METHOD OF MANUFACTURING THE SAME

(75) Inventor: Kazuyoshi Ueno, Kanagawa (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/489,625

(22) Filed: Jul. 20, 2006

(65) Prior Publication Data

US 2007/0018332 A1    Jan. 25, 2007

(30) Foreign Application Priority Data

Jul. 25, 2005    (JP)    ............... 2005-213593

(51) Int. Cl.
*H01L 23/48*    (2006.01)
(52) U.S. Cl. ............ 257/751; 257/762; 257/774; 257/E23.078
(58) Field of Classification Search ......... 438/687; 257/751, 752, 762, 774
See application file for complete search history.

(56) References Cited

U.S. PATENT DOCUMENTS 5,695,810 A * 12/1997 Dubin et al. ............ 438/643

7,193,323 B2 * 3/2007 Cabral et al. ............ 257/751

FOREIGN PATENT DOCUMENTS

| JP | 09-064034 | 3/1997 |
| JP | 2003-100746 | 4/2003 |
| JP | 2003-243392 | 8/2003 |

* cited by examiner

*Primary Examiner*—Jack Chen
(74) *Attorney, Agent, or Firm*—Young & Thompson (57) ABSTRACT

The method of manufacturing a semiconductor device according to the present invention includes: forming an interconnect trench in an insulating film formed on a semiconductor substrate (S100); forming a barrier metal layer on the whole surface of the insulating film (S102); forming a copper layer on the whole surface of the barrier metal layer so that the copper layer is embedded in the interconnect trench (S104); removing the copper layer outside the interconnect trench by polishing under a condition that the barrier metal layer is left on the surface of the insulating film (S106); selectively forming a cap metal layer on the copper layer formed in the interconnect trench after the step of removing the copper layer by polishing (S108); and flattening the cap metal layer by polishing (S110).

20 Claims, 6 Drawing Sheets

SEMICONDUCTOR DEVICE AND METHOD OF MANUFACTURING THE SAME

This application is based on Japanese Patent application NO. 2005-213593, the content of which is incorporated hereinto by reference.

BACKGROUND

1. Technical Field

The present invention relates to a semiconductor device and a method of manufacturing the same.

2. Related Art

Conventionally, there has been known a configuration in which a cap layer having a function as a copper diffusion barrier is formed on copper interconnect lines in a semiconductor device including the copper interconnect lines. There is disclosed a semiconductor device with a configuration in a Japanese Laid-open patent publication No. 2003-243392, wherein a cap layer is formed on metal interconnects including copper, and the cap layer has a silicide surface according to the configuration. According to the Japanese Laid-open patent publication No. 2003-243392, it is possible to effectively prevent oxidation and erosion by hydrofluoric acid by the configuration in which the cap layer has the silicide surface.

According to Japanese Laid-open patent publication No. 2003-100746, there is disclosed processing in which there are included a step of forming a conductive film on a whole surface of a semiconductor substrate, wherein the film is embedded in a concave pattern; a step of removing the conductive film in regions other than those of the concave pattern; a step of forming a conductive cap layer on the conductive film by selective growth or preference growth; and a step of removing extraneous matters on the surface of an insulating film by Chemical Mechanical Polishing (CMP) thereafter. According to Japanese Laid-open patent publication No. H9-064034, steps according to which an interconnect material layer is anisotropically deposited, a surface protection layer is formed on the whole surface, and, thereafter, a diffusion barrier, an interconnect layer, and the surface protection layer, other than those for an interconnect trench, are removed by the CMP method, an etching back method, and the like, are described.

Figure 4:
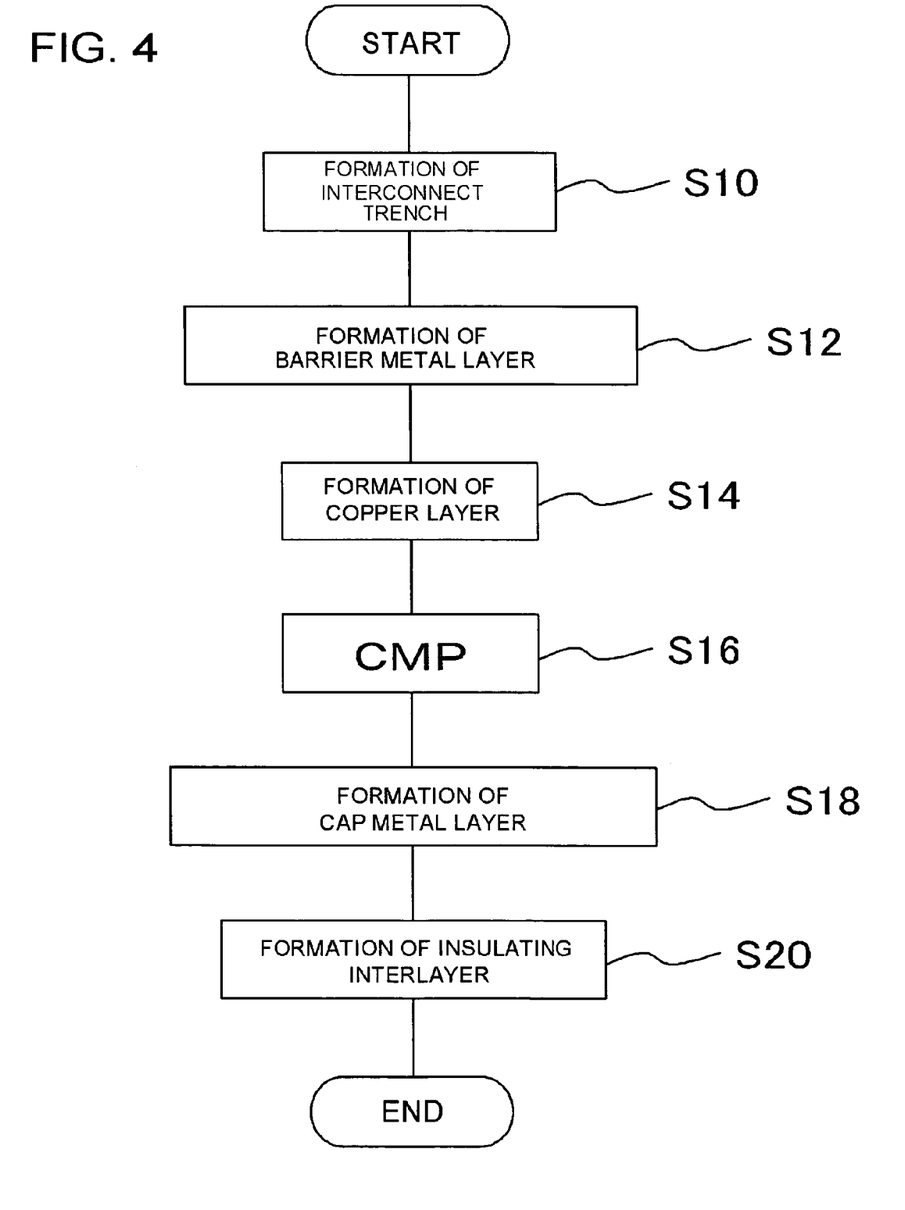
FIG. 4 is a flow chart showing a manufacturing procedure for a conventional semiconductor device with a cap layer.

FIG. 4 is a flow chart showing a manufacturing procedure for manufacturing a conventional semiconductor device with a cap layer. Moreover, FIGS. 5A to 5E are a cross-sectional view of the conventional semiconductor device at each step in the manufacturing procedure. Hereinafter, the manufacturing procedure of the conventional semiconductor device will be explained, referring to FIG. 4 and FIGS. 5A to 5E.

Figure 5A:
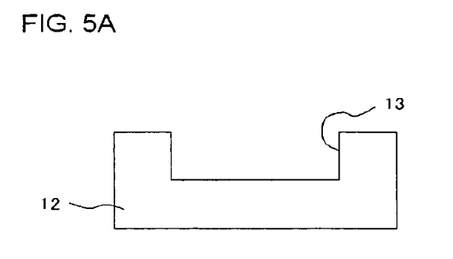
FIGS. 5A to 5E are cross-sectional views of the conventional semiconductor device at a step in the manufacturing procedure.
Figure 5B:
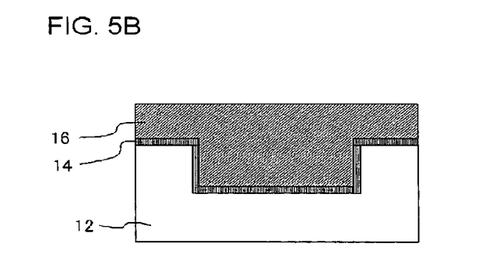

Firstly, an interconnect trench 13 is formed in an insulating interlayer 12 formed on a semiconductor substrate (not shown) (FIG. 5A corresponding to a step S10 shown in FIG. 4). Subsequently, a barrier metal layer 14 and a copper layer 16 are formed on a whole surface of the semiconductor substrate (FIG. 5B corresponding to step S12 and S14 shown in FIG. 4). The barrier metal layer 14 may include, for example, TaN, Ta, Ti, TiN, W, WN, and the like. The copper layer 16 may be formed as described hereafter. In the first place, a copper seed layer is formed by a Chemical Vapor Deposition (CVD) method or by a physical vapor deposition (PVD) method. Subsequently, the copper layer is formed by electroplating, and is embedded in the interconnect trench 13.

Figure 5C:
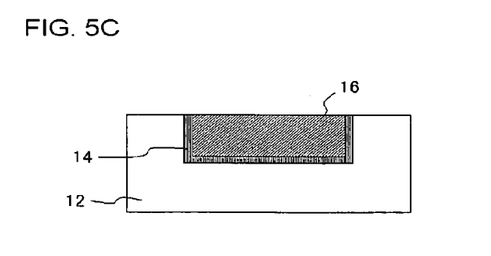
Figure 5D:
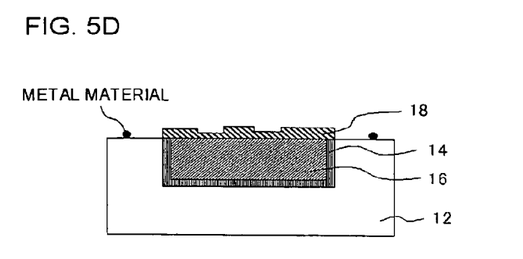

Then, the copper layer 16 and the barrier metal layer 14, which have been exposed in the outside of the interconnect trench 13, are removed by the CMP method (FIG. 5C corresponding to a step S16 shown in FIG. 4). Thereby, copper interconnect lines are formed. Thereafter, a cap metal layer 18 is selectively formed on the copper layer 16 by electroless plating (FIG. 5D corresponding to a step S18 shown in FIG. 4). Here, the cap metal layer 18 may include, for example, CoWP.

Subsequently, an insulating interlayer 20 is formed on a whole surface of the semiconductor substrate (FIG. 5E corresponding to a step S20 shown in FIG. 4).

Figure 6:
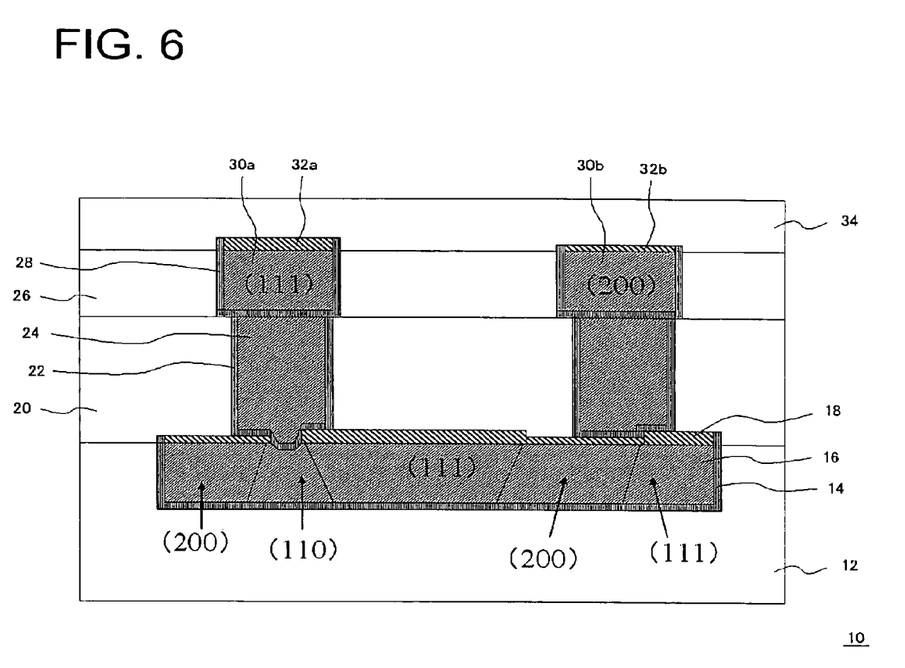
FIG. 6 is a schematic cross-sectional view of the configuration of the conventional semiconductor device.

FIG. 6 is a schematic cross-sectional view showing the configuration of a semiconductor device 10 which has been manufactured according to the above-described procedure. Here, the insulating interlayer 20, an insulating interlayer 26, and an insulating interlayer 34 are formed on the insulating interlayer 12. A via including a barrier metal layer 22 and a via layer 24 is formed in the insulating interlayer 20. An interconnect including a barrier metal layer 28 and a copper layer 30a, and an interconnect including the barrier metal layer 28 and a copper layer 30b are formed in the insulating interlayer 26. A cap metal layer 32a is formed on the copper layer 30a, and a cap metal layer 32b is formed on the copper layer 30b.

As shown in FIG. 6, each grain has a different orientation, for example, (111), (200) or (110), in the copper layer 16. Therefore, the grains with different orientations from each other are exposed on the surface of the copper layer 16. When the orientation on the surface of the copper layer 16 is not uniform, there may occur a variation in the formation of the cap metal layer 18 formed thereon depending on a difference in the orientation to cause a difference in the layer thickness. In order to prevent copper diffusion in the copper layer 16, and deterioration in the reliability of Electro-Migration (EM), Stress Induced Void (SIV), and the like of the copper layer 16, it is required to securely cover the whole surface of the copper layer 16 with the cap metal layer 18. Accordingly, it is required to cover the copper layer with the cap metal layer 18 even in a region in which the cap metal layer 18 is hardly formed. That is, the layer thickness becomes thicker in a region in which the cap metal layer 18 is formed in an easier manner. When the layer thickness of the cap metal layer 18 becomes thicker, the resistance of a via formed on the layer 18 is increased.

FIG. 6 shows the cross section including the orientation (111) in the copper layer 30a, and the cross section including the orientation (200) in the copper layer 30b. In the above case, the layer thickness of the cap metal layer 32a and that of the cap metal layer 32b, wherein the cap metal layers are formed on the corresponding interconnect, depend on the orientation of the copper layer under the corresponding cap metal layer. When the layer thickness is not made uniform between the cap metal layer 32a and the cap metal layer 32b as described above, a variation in the via resistances is caused.

Moreover, when the insulating interlayer is deposited on the cap metal layer 18 under a state in which the surface of the cap metal layer 18 has irregularities, there is caused a problem that the flatness of the semiconductor device 10 is deteriorated.

There is caused a similar problem to that of the above case even in the semiconductor device disclosed in the Japanese Laid-open patent publication No. 2003-243392, because, when the surface of the cap metal layer has irregularities, the silicide surface of the semiconductor device is affected by the surface irregularity of the cap metal layer. In addition, when the cap metal layer is formed on the insulating interlayer, the reliability is deteriorated.

Moreover, a metal material of the cap metal layer 18 may adhere to the surface of the insulating interlayer 12 (black points in FIGS. 5D and 5E) in the steps for forming the cap metal layer 18. When the metal material adheres to the surface of the insulating interlayer 12, a short is caused between interconnects, or the reliability of Time Dependent Dielectric Breakdown (TDDB) and the like is deteriorated.

According to the processing described in the Japanese Laid-open patent publication No. 2003-100746, an extraneous matter on the surface of the insulating film is removed after the cap metal layer is formed. Therefore, the number of steps is increased. Moreover, it is difficult to completely remove the extraneous matter on the surface of the insulating film.

SUMMARY OF THE INVENTION

According to the present invention, there is provided a method of manufacturing a semiconductor device, including: forming a concave portion in an insulating film formed on a semiconductor substrate; forming a barrier metal layer on the whole surface of the insulating film; forming a copper layer on the whole surface of the barrier metal layer so that the copper layer is embedded in the concave portion; removing the copper layer outside the concave portion by polishing, while leaving the barrier metal layer on the whole surface of the insulating film; selectively forming a cap metal layer on the copper layer formed in the concave portion after removing the copper layer by polishing; and flattening the cap metal layer by polishing, wherein at the step of flattening the cap metal layer by polishing, the barrier metal layer outside the concave portion is removed by polishing. Here, the concave portion may include a trench or a hole.

According to the above-described method, the surface of the cap metal layer may be flattened. Therefore, the surface of the cap metal layer may be made smooth at the step even when the surface of the cap metal layer has irregularities right after it is formed on the copper layer which is configured to, for example, have a plurality of orientations. Moreover, the layer thickness of the cap metal layer may be made uniform. Thereby, the preferable yield rate, and the excellent uniformity in the resistance of via connection may be maintained when a via is formed on the copper layer. Moreover, the flatness of the semiconductor device may be made preferable. Furthermore, in the present invention the layer thickness of the cap metal layer formed on the copper layer may be made more uniform at the step of removing the copper layer by polishing, because the surface of the copper layer is also flattened.

Moreover, the barrier metal layer is formed on the insulating film when the cap metal layer is formed, and the barrier metal layer is simultaneously removed when the cap metal layer is flattened. Therefore, a metal material may be prevented from adhering to the surface of the insulating film. Moreover, flattening of the cap metal layer and removing of the barrier metal layer are performed at the same time to obtain the above-described effect without increasing the number of steps. Thereby, the manufacturing cost of the semiconductor device may be suppressed. Furthermore, when, for example, a porous material is used as an insulating film, it becomes easier to form a degenerated layer on the surface of the insulating film, or in the insulating film under a condition that a metal material adheres to the surface of the insulating film when the cap metal layer is formed. However, formation of such a degenerated layer may be suppressed according to the method of manufacturing a semiconductor device of the present invention because the surface of the insulating film is covered with the barrier metal layer when the cap metal layer is formed. Thereby, deterioration in the reliability of leakage, TDDB, and the like may be prevented.

Here, the step of removing by polishing, and that of flattening by polishing may be performed by the CMP method. Moreover, the cap metal layer may be formed with a material different from that of the barrier metal layer or the copper layer. Under such a configuration, only the copper layer may be removed by proper control of polishing conditions, for example, at the step of removing the copper layer by polishing while the barrier metal layer is left. Moreover, the barrier metal layer may be removed, and, at the same time, the cap metal layer may be prevented from being polished too much when the polishing conditions are properly controlled, for example, at the step of flattening the cap metal layer by polishing.

According to an aspect of the present invention, there is provided a semiconductor device, including: a semiconductor substrate; an insulating film formed on the semiconductor substrate; an interconnect which is formed in the insulating film, and includes a copper layer with a plurality of orientations; and a cap metal layer formed on the surface of the copper layer, wherein an root-mean-square (RMS) value of the surface roughness of the cap metal layer is 10 nm or less.

According to the semiconductor device with the above-described configuration, the layer thickness of the cap metal layer may be made uniform. Thereby, the preferable yield rate, and the excellent uniformity in the resistance of via connection may be maintained when the via is formed on the copper layer. Furthermore, the preferable flatness of the semiconductor device may be realized.

According to the present invention, the preferable yield rate, and the excellent uniformity in the resistance of via connection can be maintained in the semiconductor device including the copper interconnect line on the surface of which the cap metal layer is formed.

BRIEF DESCRIPTION OF DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereinafter, embodiments of the present invention will be explained, referring to drawings. Here, similar reference numerals are applied to similar components throughout all the drawings, and the explanation of the similar components will not be repeated.

Figure 1:
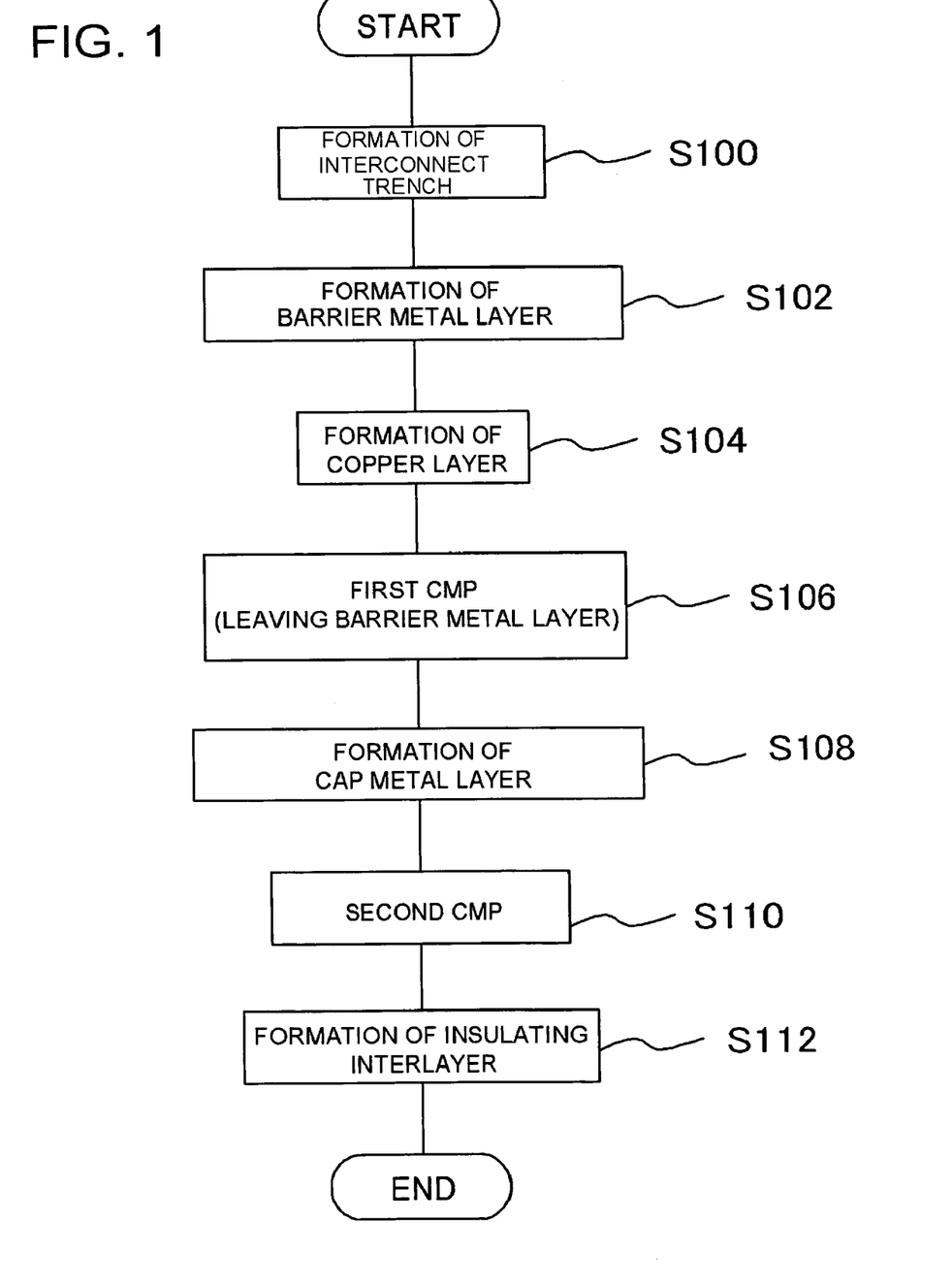
FIG. 1 is a flow chart showing a manufacturing procedure for an interconnect in a semiconductor device according to an embodiment of the present invention.

FIG. 1 is a flow chart showing a manufacturing procedure for an interconnect in a semiconductor device according to an embodiment of the present invention.

In the present embodiment, firstly, an interconnect trench (concave portion) is formed in an insulating interlayer formed on a semiconductor substrate (S100). Subsequently, a barrier metal layer is formed on the whole surface of the insulating interlayer (S102). Then, a copper layer is formed on the whole surface of the barrier metal layer (S104) so that the copper layer is embedded in the interconnect trench. Thereafter, the copper layer outside the interconnect trench is removed by polishing according to first CMP to obtain the flat layer while leaving the barrier metal layer on the whole surface of the insulating interlayer. At this time, CMP is performed under a condition that the barrier metal layer is not removed (S106). Thereafter, the cap metal layer is selectively formed on the copper layer formed in the interconnect trench (S108). Then, the cap metal layer is polished and is flattened by second CMP, and, at the same time, the barrier metal layer outside the interconnect trench is removed (S110). Thereby, an interconnect is formed. Subsequently, the insulating interlayer is formed on the whole surface of the semiconductor substrate (S112).

In the present embodiment, the surface of the cap metal layer, together with that of the barrier metal layer, is flattened by the second CMP after the cap metal layer is formed. Therefore, the surface of the cap metal layer can be flattened and the layer thickness of the cap metal layer can be made uniform even when the surface of the cap metal layer has irregularities, based on the irregularities in the orientation of the surface of the copper layer as the lower layer of the cap metal layer. Thereby, the preferable yield rate, and the excellent uniformity in the resistance of via connection may be maintained when a via is formed on the copper layer. Furthermore, the flatness of the semiconductor device may be made preferable.

Moreover, even when the cap metal layer with a thicker layer thickness is formed, the portion in which the thicker layer is formed may be removed because the cap metal layer is flattened flat by the second CMP. Therefore, the cap metal layer may be surely formed on the whole surface of the copper layer because it is possible to form the cap metal layer with a thick layer thickness so that the metal layer covers the whole surface of the copper layer. Thereby, copper diffusion by the cap metal layer may be surely prevented, and, at the same time, the reliability of EM, SIV, and the like can be improved.

Furthermore, when the cap metal layer is formed, the barrier metal layer is formed on the insulating interlayer according to the manufacturing procedure for the semiconductor device in the present embodiment. Moreover, the barrier metal layer is removed by the second CMP. Therefore, a metal material of the cap metal layer may be prevented from adhering to the surface of the insulating interlayer. Thereby, a short between interconnects may be prevented to secure high reliability of TDDB and the like.

FIGS. 2A to 2F are a cross-sectional view of the interconnect in the semiconductor device according to the present invention at each step in the manufacturing procedure.

Figure 2A:
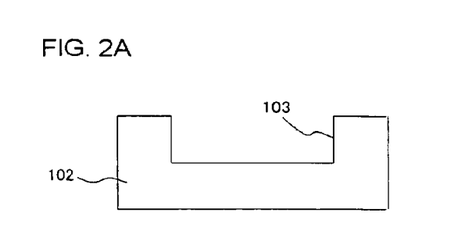
FIGS. 2A to 2F are cross-sectional views of the interconnect in the semiconductor device according to an embodiment of the present invention at a step in the manufacturing procedure.

Firstly, an interconnect trench 103 is formed in a first insulating interlayer 102 formed on a semiconductor substrate (not shown) (FIG. 2A). The semiconductor substrate may be, for example, a silicon substrate. A resist film patterned in a predetermined shape is formed on the first insulating interlayer 102 by a lithography technology and an etching technology, which have been known, and the interconnect trench 103 may be formed, using the resist film as a mask.

Figure 2B:
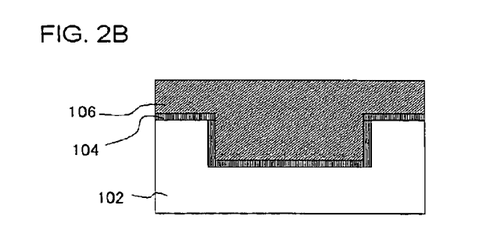

Subsequently, a barrier metal layer 104 and a copper layer 106 are formed on a whole surface of the semiconductor substrate (FIG. 2B). The barrier metal layer 104 may be formed by, for example, a sputtering method. The barrier metal layer 104 may include, for example, TaN, Ta, Ti, TiN, W, WN, TiSiN, TaSiN, or the like. The barrier metal layer 104 may be of a stacked layer including the above-described materials. The copper layer 16 may be formed as described hereafter. Firstly, a copper seed layer is formed by the CVD method or by the PVD method. Subsequently, the copper layer is formed by electroplating, and is embedded in the interconnect trench 103. Moreover, the copper layer 106 may be also formed by the CVD method, the PVD method, or by the sputtering method. The copper layer 106 may include in addition to cupper, for example, a metal, other than copper such as silver, and may be an alloy of copper and a metal such as silver, and Al.

Figure 2C:
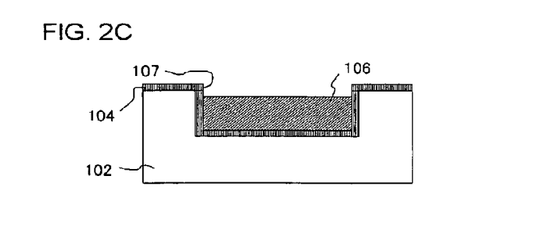

Then, the copper layer 106, which have been exposed in the outside of the interconnect trench 103, is removed by the first CMP (FIG. 2C). Here, the first CMP is preferably performed under a condition that a selection ratio between the copper layer 106 and the barrier metal layer 104 is high such that the barrier metal layer 104 is hard to be polished. Moreover, it is preferable to polish the copper layer 106 in the interconnect trench 103 to a predetermined thickness, and to form a recess 107 in the interconnect trench 103. At this time, the height of the surface of the copper layer 106 may be preferably configured to be located at a lower position than that of the height of the surface of the first insulating interlayer 102.

Figure 2D:
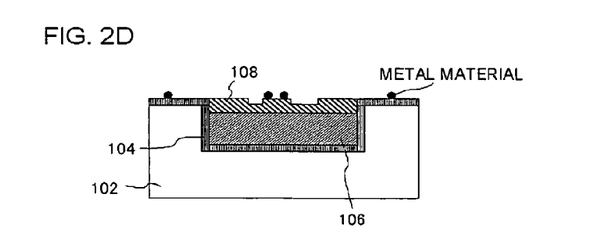

Subsequently, a cap metal layer 108 is selectively formed on the copper layer 106 by electroless plating (FIG. 2D). Various kinds of materials, which are generally used as a material for a cap metal layer, may be used for the cap metal layer 108. The cap metal layer 108 may include a material including, for example, Co, Ni, Ru, Rh, Pd, Ag, Sn, Sb, Cd, In, Pt, Au, Pb or Bi. Moreover, the cap metal layer 108 may include an alloy of B, N, P, V, Cr, Mn, Fe, W, Re or Mo, and another metal.

In the present embodiment, it is preferable that the cap metal layer 108 includes a material different from that of the barrier metal layer 104. Thereby, when the cap metal film 108 and the barrier metal layer 104 is removed by the CMP at a later step, the center portion of the cap metal layer 108 may be prevented form being polished too much by proper setting of polishing conditions.

Moreover, the cap metal layer 108 may include material different from that of the copper layer 106. The cap metal layer 108 may include a material which the adhesive property to the insulating interlayer and the barrier metal layer is better than that of the copper layer 106. Furthermore, the cap metal layer 108 may be composed of an amorphous material. The diffusion barrier property for copper can be improved by using the amorphous material for the cap metal layer 108, and copper diffusion prevention does not require further installation of another barrier insulating film. Thereby, there may be applied a configuration in which the barrier insulating film with a generally high dielectric constant is not used. Accordingly, interconnect capacity can be reduced. Moreover, diffusion of copper included in the copper layer 106 maybe controlled. From such a viewpoint, the cap metal layer 108 may be configured to include P, B, or W. The cap metal layer 108 is configured to include CoWP, and crystal-grain growth of Co as a main ingredient is controlled, for example, by increasing the density of P and W to make the cap metal layer 108 amorphous or microcrystalline.

Moreover, the layer thickness of the cap metal layer 108 may be formed thicker than a desired layer thickness (for example, 5 to 25 nm) for a final product, and, thereafter, may be flattened to the desired layer thickness. In the present embodiment, the layer thickness of the cap metal layer 108 may be, for example, 20 to 60 nm. Thereby, the layer thickness may be made to the desired value at a later step of flattening while the surface of the cap metal layer 108 is flattened.

In the present embodiment, the cap metal layer 108 may include, for example, a multicomponent alloy composed of CoB, CoWP, NiWP, and the like. A metal-to-metal bond is formed between the copper layer 106 and the cap metal layer 108 by providing the cap metal layer 108 with the above configuration, and preferable EM and SIV may be maintained.

When the cap metal layer 108 is composed of, for example, COWP, the layer may be formed as follows. In the first place, a palladium catalyst is formed on the surface of the copper layer 106 to form a CoWP film on the surface of the copper layer 106 by electroless plating. Thereby, the cap metal layer 108 is formed. Moreover, the CoWP film may be deposited without using the palladium catalyst.

Figure 2E:
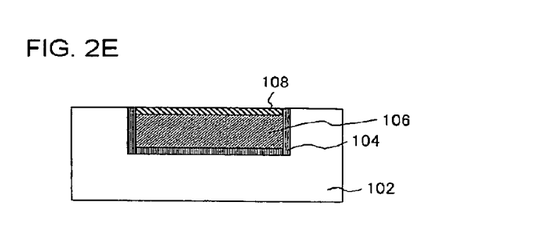

Then, the barrier metal layer 104, which have been exposed in the outside of the interconnect trench 103, is removed by the second CMP.

At this time, the surface of the cap metal layer 108 is also flattened at the same time (FIG. 2E). Thereby, the height of the surface of the cap metal layer 108 is formed to be equal to that of the surface of the first insulating interlayer 102. Moreover, even when metal materials (black points in FIG. 2D) of the barrier metal layer 104 adhere to the surfaces other than the surface of copper layer 106, the metal materials may be removed by the second CMP.

Subsequently, conditions for the second CMP will be explained. In the second CMP, the barrier metal layer 104, which have been exposed in the outside of the interconnect trench 103, is removed, and the surface of the cap metal layer 108 is also flattened at the same time so that the surface roughness of the cap metal layer 108 is controlled to be a desired value. Here, the RMS value of the surface roughness of the cap metal layer 108 may be set to 10 nm or less, preferably, 5 nm or less, or, more preferably, 2 nm or less. Thereby, variations in the resistances of the interconnect and the via may be controlled.

Here, a via resistance R due to the cap metal layer 108 is obtained from the following formula.

$$R = \rho \times t / S \quad (1)$$

(Where $\rho$: resistance rate of CoWP, t: film thickness of CoWP, and S: base area of via)

When the above described via resistance R is, for example, five $\Omega$, an admissible variation in the resistances $\Delta R$ is 0.5 $\Omega$ under a condition that the variation in the resistance of the via is within a required value of 10%. Hereinafter, the diameter of the via is assumed to be 100 nm (the radius 50 nm).

From the formula (1), $t = R \times S / \rho$, and $\Delta t = \Delta R \times S / \rho$. Here, $\Delta R = 0.5 \, \Omega$, $S = \pi (50 \, nm)^2$, $\rho = 50 \, \mu\Omega cm$, and $\Delta t = 7.9$ nm. That is, the variation in the layer thickness of the cap metal layer is required to be configured to be 7.9 nm or less under the above conditions.

The RMS value of the surface roughness of the cap metal layer 108 maybe suitably set, depending on the used material, the resistance of the via, the required value of the variation, and the like, but the inventors of the present invention has examined the conditions for the second CMP in such a way that the RMS value of the surface roughness of the cap metal layer 108 is 10 nm or less, preferably, 5 nm or less, or, more preferably, 2 nm or less.

In the present embodiment, for example, slurry including chemicals, which form a corrosion layer on the surface of the cap metal layer 108 and that of the barrier metal layer 104, is used in the second CMP in order to polish the surfaces of the cap metal layer 108 and that of the barrier metal layers 104 at the same time. Moreover, acid slurry, which uses oxidizing agents with, for example, alumina as abrasive grains may be used as the slurry. Thereby, a metal oxidation layer (corrosion layer), which is chemically formed on the surface to be polished, may be polished by physical removal of the layer with the polishing grains.

For example, the Japanese Laid-open patent publication No. 2003-100746 has disclosed the processing in which CMP is performed in order to remove an extraneous matter on the surface of the insulating film after the cap metal layer is formed. However, the subject for the CMP is the insulating film in the CMP which is performed in order to remove the extraneous matter on the surface of the insulating film, and it is considered that the CMP conditions in the Japanese Laid-open patent publication No. 2003-100746 are different form those of the second CMP in the present embodiment in which the CMP is performed in order to flatten the surface of the cap metal layer 108. The surface roughness of the cap metal layer 108 may not be made to the above-described desired value only by the CMP processing for the surface of the insulating film.

Moreover, in the present embodiment, the cap metal layer 108 may be configured so that the whole surface of the copper layer 106 is covered even after the second CMP processing.

Figure 2F:
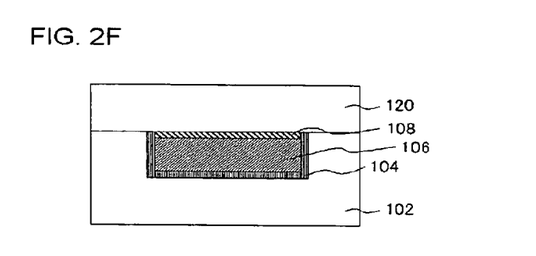

Subsequently, a second insulating interlayer 120 is formed on the first insulating interlayer 102 (FIG. 2F).

Figure 3:
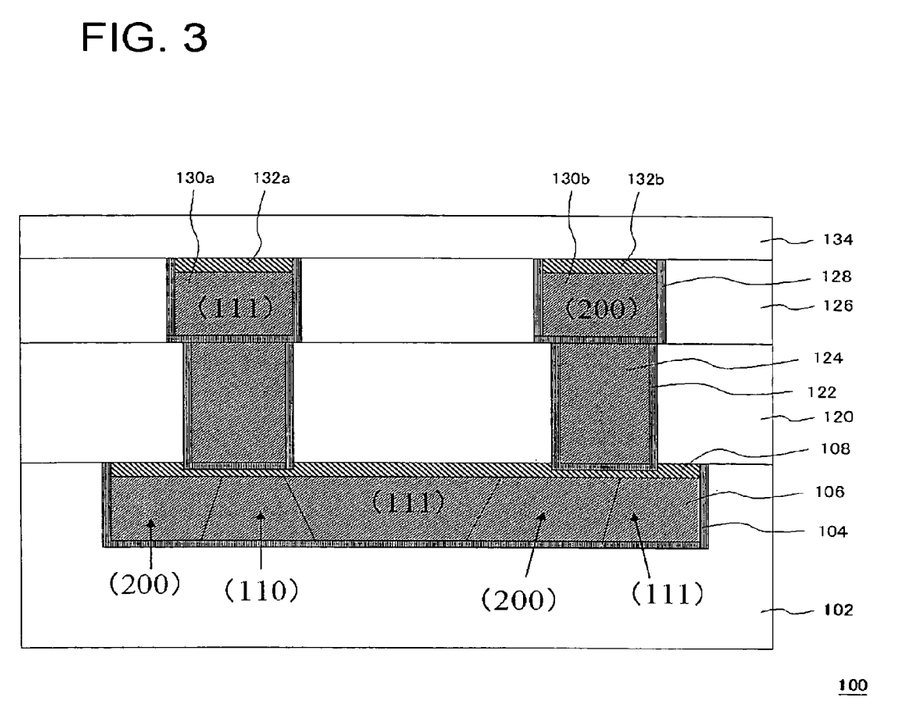
FIG. 3 is a schematic cross-sectional view of the configuration of the semiconductor device according to the embodiment of the present invention.

FIG. 3 is a schematic cross-sectional view of the configuration of a semiconductor device 100 in which vias and upper interconnects are formed on the interconnects formed as described above.

Barrier metal layers 122 and via layers 124 are formed on the second insulating interlayer 120 formed on the first insulating interlayer 102. Moreover, a third insulating interlayer 126 is formed on the second insulating interlayer 120. An interconnect including the barrier metal layer 128 and the copper layer 130a, and an interconnect including the barrier metal layer 128 and the copper layer 130b are formed on the third insulating interlayer 126. A cap metal layer 132a is formed on the copper layer 130a, and a cap metal layer 132b is formed on the copper layer 130b.

Here, the interconnect formed on the third insulating interlayer 126 may be formed according to a similar procedure to that of the interconnect formed on the first insulating interlayer 102. That is, the first CMP is performed in the first place after the copper layer 130a and the copper layer 130b are formed. Then, the barrier metal layer 128, which have been formed in the outside of the interconnect trench in the third insulating interlayer 126 is removed by the second CMP after the cap metal layer 132a and the cap metal layer 132b are respectively formed on the copper layer 130a and the copper layer 130b. At this time, the surface of the cap metal layer 132a and that of the cap metal layer 132b are also flattened. Thereby, the cap metal layer 132a and that of the cap metal layer 132b may have the same layer thickness though both the interconnects on which the corresponding cap metal layer is formed are different from each other in the orientation of the copper layer. Moreover, a fourth insulating interlayer 134 is formed on the third insulating interlayer 126. A multilayer interconnect structure can be maintained by repeating the above-described procedure. The semiconductor device 100 formed as described above may have preferable flatness.

In the present embodiment, the first insulating interlayer 102 and the third insulating interlayer 126 may include a film with a low dielectric constant of, for example, 3.3 or less, or more preferably, 2.9 or less. The first insulating interlayer 102 and the third insulating interlayer 126 may include, for example, SiOC (SiOCH), methyl silsesquioxane (MSQ), methylated hydrogen silsesquioxane (MHSQ), organo-polysiloxane, or porous layers of the above-described films, or the like. Moreover, other insulating films such as the second insulating interlayer 120, and the fourth insulating film 134 may be formed with a material having a low dielectric constant, but the other insulating films may also be formed with, for example, a silicone oxide layer, and the like.

Moreover, an etching stopper (not shown) may be configured to be provided between the insulating interlayers.

EXAMPLE

Example 1

According to the procedure which has been explained, referring to FIGS. 2A to 2F, the semiconductor device with the configuration shown in FIG. 2F was manufactured. Here, the first insulating interlayer 102 was composed of a SiOC film, the barrier metal layer 104 was composed of a Ta/TaN film, and the cap metal layer 108 was composed of a CoWP film. Firstly, the interconnect trench 103 was formed in the insulating interlayer 102 by dry etching, as shown in FIG. 2A. As shown in FIG. 2B, the TaN film was deposited to a layer thickness of 20 nm, and the Ta film was deposited to a layer thickness of 10 nm to form the barrier metal layer 104. Furthermore, the copper seed layer was deposited to a layer thickness of 100 nm by sputtering, and the copper layer was deposited to a layer thickness to 800 nm by electroplating. Subsequently, the copper layer formed outside the interconnect trench was removed by CMP, as shown in FIG. 2C. At this time, CMP time was adjusted so that a recess with a height of about 50 nm from the upper surface of the barrier metal layer 104 was formed on the upper surface of the copper layer. Then, the CoWP film was deposited to a mean layer thickness of about 50 nm by electroless plating as shown in FIG. 2D. Thereafter, as shown in FIG. 2E, the CoWP film and the Ta/TaN film were simultaneously polished to remove the barrier metal layer 104, and the CoWP film was left on the surface of the Cu layer. At this time, slurry including chemicals, which forms a corrosion layer on the surface of the CoWP film and that of the Ta/TaN film, was used. As a result, the layer thickness of the CoWP film became about 20 nm. Then, the SiOC film was deposited as the insulating interlayer to a layer thickness of 400 nm as shown in FIG. 2F.

Example 2

Figure 5E:
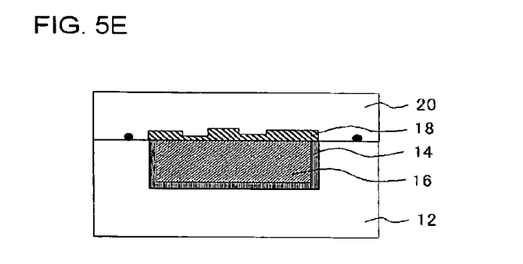

According to the procedure which has been explained, referring to FIGS. 5A to 5F, the semiconductor device with the configuration shown in FIG. 5E was manufactured. Here, the first insulating interlayer 12 was composed of SiOC film, the barrier metal layer 14 was composed of a Ta/TaN film, and the cap metal layer 18 was composed of a CoWP film. The cap metal layer 18 was formed in a similar manner to that of the cap metal layer 108 in the example 1.

The surface roughness of the surfaces of the cap metal layers in the semiconductor devices manufactured in the examples 1 and 2 was measured under the following conditions, using an atomic force microscope (AFM).

Measuring Range: 10 um$^2$;
Measuring resolution: 0.05 um;
Step Measuring Range: 20 nm; and
Step Measuring Accuracy: 0.5 nm After the cap metal layer 108 was formed in the example 1, the RMS value of the surface roughness of the cap metal layer 108 was about 2 to 5 nm after the second CMP. Moreover, according to observations by a scanning electron microscope (SEM), it was confirmed that the surface of the cap metal layer and that of the insulating interlayer on which the cap metal layer was formed were on the same plane.

After CMP performed after the copper layer 16 was formed in the example 2, the RMS value of the surface roughness of the copper layer 16 was about 5 to 10 nm. Thereafter, the RMS value of the surface roughness of the cap metal layer 18 was about 30 nm after the cap metal layer 18 was formed on the copper layer 16.

As described above, the surface of the cap metal layer is flattened according to the method of manufacturing the semiconductor device 100 in the present embodiment. Thereby the layer thickness of the cap metal layer may be made even. Therefore, the excellent yield rate, and the excellent uniformity in the resistance of via connection may be maintained when a via is formed on the copper layer. Furthermore, the semiconductor device may have preferable flatness. Moreover, the cap metal layer may be surely formed on the whole surface of the copper layer. Thereby, copper diffusion by the cap metal layer may be surely prevented, and, at the same time, the reliability of EM, SIV, and the like can be improved.

As described above, the present invention has been explained, based on the embodiment, and the examples. It will be appreciated by persons skilled in the art that the present embodiment and the present examples are illustrative and not restrictive, and various modifications may be made without departing from the scope of the present invention.

Here, the example in which the conditions by which the recess 107 is formed in the interconnect trench 103 are used when the copper layer 106 is removed by CMP (first CMP) has been explained in the above-described embodiment. However, a configuration in which the 107 is not formed can be applied. In this case, a condition in which the barrier metal layer 104 is removed more easily than the cap metal layer 108 may be used in the second CMP. Moreover, for example, a WN layer and the like, which are removed in an easier manner, may be used as the barrier metal layer 104. Thereby, even in the configuration in which the recess 107 is not formed, the surface roughness of the cap metal layer 108 may be controlled to have a desired value.

Here, the above-described embodiment has shown that the barrier metal layer 104 is left on the surface of the insulating interlayer 102 in the first CMP, the cap metal layer 108 and the barrier metal layer 104 are simultaneously polished in the second CMP, the surface of the cap metal layer 108 is flattened, and the semiconductor device, in which the surface roughness of the cap metal layer 108 is a desired value, is obtained according to the present invention. However, the semiconductor device according to the present invention is not limited to the device manufactured according to the above-described manufacturing process. According to, for example, a configuration in which the barrier metal layer 104 in the outside of the interconnect trench 103 is removed by the first CMP, and the cap metal layer 108 is polished, and the surface of the cap metal layer 108 is flattened by the second CMP, a semiconductor device, in which the surface roughness of the cap metal layer 108 is a desired value, may be also obtained according to the present invention.

It is apparent that the present invention is not limited to the above embodiment, that may be modified and changed without departing from the scope and spirit of the invention.

What is claimed is:

1. A semiconductor device, including:
   a semiconductor substrate;
   an insulating film formed on said semiconductor substrate;
   an interconnect which is formed in said insulating film, and includes a copper layer with a plurality of orientations; and
   a cap metal layer formed on a surface of said copper layer, the cap metal layer having a final layer thickness of 5 to 25 nm,
   wherein an RMS value of a surface roughness of said cap metal layer is 10 nm or less.

2. The semiconductor device according to claim 1, wherein said cap metal layer has a flattened surface.

3. The semiconductor device according to claim 1, wherein said interconnect further includes a barrier metal layer, and
   said cap metal layer is formed with a material different from that of said barrier metal layer.

4. The semiconductor device according to claim 2, wherein said interconnect further includes a barrier metal layer, and
   said cap metal layer is formed with a material different from that of said barrier metal layer.

5. The semiconductor device according to claim 1, wherein said cap metal layer is formed with an amorphous material.

6. The semiconductor device according to claim 2, wherein said cap metal layer is formed with an amorphous material.

7. The semiconductor device according to claim 3, wherein said cap metal layer is formed with an amorphous material.

8. The semiconductor device according to claim 1, wherein an upper surface of said cap metal layer is formed to substantially be flat with that of said insulating film.

9. The semiconductor device according to claim 2, wherein an upper surface of said cap metal layer is formed to substantially be flat with that of said insulating film.

10. The semiconductor device according to claim 3, wherein an upper surface of said cap metal layer is formed to substantially be flat with that of said insulating film.

11. The semiconductor device according to claim 4, wherein an upper surface of said cap metal layer is formed to substantially be flat with that of said insulating film.

12. The semiconductor device according to claim 5, wherein an upper surface of said cap metal layer is formed to substantially be flat with that of said insulating film.

13. The semiconductor device according to claim 6, wherein an upper surface of said cap metal layer is formed to substantially be flat with that of said insulating film.

14. The semiconductor device according to claim 7, wherein an upper surface of said cap metal layer is formed to substantially be flat with that of said insulating film.

15. The semiconductor device according to claim 1, wherein the RMS value of the surface roughness of said cap metal layer is 5 nm or less.

16. The semiconductor device according to claim 1, wherein the RMS value of the surface roughness of said cap metal layer is 2 nm or less.

17. The semiconductor device according to claim 1, wherein the RMS value of the surface roughness of said cap metal layer is 2-5 nm.

18. The semiconductor device according to claim 1, wherein a via resistance R due to the cap metal layer is determined by $R=\rho \times t/S$, where $\rho$ is the resistance rate of the cap metal, t is the film thickness of the cap metal and S is a base area of the via.

19. The semiconductor device according to claim 17, wherein $t=R\times S/\rho$, $\Delta t=\Delta R\times S/\rho$, and $\Delta R=0.5\Omega$, $S=\Pi(50\ nm)^2$, $\rho=50\ \mu\Omega cm$, and $\Delta t=7.9$ nm.

20. The semiconductor device according to claim 1, wherein a variation of the layer thickness of the cap metal layer is 7.9 nm or less.

* * * * *